(12) United States Patent
Pradelles et al.

(10) Patent No.: US 10,809,311 B2
(45) Date of Patent: Oct. 20, 2020

(54) DEVICE FOR DETECTING A SHORT CIRCUIT OF AN H BRIDGE

(71) Applicants: CONTINENTAL AUTOMOTIVE FRANCE, Toulouse (FR); CONTINENTAL AUTOMOTIVE GMBH, Hannover (DE)

(72) Inventors: Christian Pradelles, Eaunes (FR); Julien Mouret, Pamiers (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 348 days.

(21) Appl. No.: 15/735,692

(22) PCT Filed: Jun. 14, 2016

(86) PCT No.: PCT/EP2016/000989
§ 371 (c)(1),
(2) Date: Dec. 12, 2017

(87) PCT Pub. No.: WO2016/202452
PCT Pub. Date: Dec. 22, 2016

(65) Prior Publication Data
US 2020/0041557 A1    Feb. 6, 2020

(30) Foreign Application Priority Data
Jun. 15, 2015   (FR) ..................... 15 55445

(51) Int. Cl.
*G01R 31/00*     (2006.01)
*G01R 31/50*     (2020.01)
*G01R 1/04*      (2006.01)

(52) U.S. Cl.
CPC ........... *G01R 31/50* (2020.01); *G01R 1/0416* (2013.01)

(58) Field of Classification Search
CPC ........ G01R 31/40; G01R 31/50; G01R 31/42; H02H 7/09; H02H 7/1225; H02H 7/1227; H02H 7/0838
See application file for complete search history.

(56) References Cited

U.S. PATENT DOCUMENTS 5,111,123 A * 5/1992 Hach .................... H02H 7/0838
                                                        318/434
6,025,695 A * 2/2000 Friel ................... H02J 7/00036
                                                        320/106

(Continued)

FOREIGN PATENT DOCUMENTS

CN     101103507 A     1/2008
CN     101874346 A    10/2010

(Continued)

OTHER PUBLICATIONS

International Search Report, dated Sep. 8, 2016, from corresponding PCT application No. PCT/EP2016/000989.

*Primary Examiner* — Alesa Allgood
(74) *Attorney, Agent, or Firm* — Nixon & Vanderhye

(57) ABSTRACT

Disclosed is a device for detecting a short circuit of an H bridge, the device including a printed circuit including a power trace connecting the H bridge to a first connection area intended to be connected to a first multipin connector connected to a power supply terminal of a power source, and an earth trace connecting the H bridge to a second connection area intended to be connected to a second multipin connector connected to a reference terminal of the power source. The device further includes a measurement unit for measuring two potentials at two different points of the first connector, as well as two potentials at two different points of (Continued)

the second connector, and a processor configured to detect a short circuit of the H bridge by comparison of the potentials.

18 Claims, 1 Drawing Sheet

(56) References Cited

U.S. PATENT DOCUMENTS

| | | |
|---|---|---|
| 9,568,560 B2 | 2/2017 | Pasqualetto |
| 2009/0135531 A1 | 5/2009 | Hirata |
| 2010/0109598 A1 | 5/2010 | Otten et al. |
| 2013/0083434 A1 | 4/2013 | Barth |
| 2015/0145553 A1* | 5/2015 | Pasqualetto ............ G01R 31/40 324/764.01 |
| 2015/0194915 A1* | 7/2015 | Mulliken ................ H02P 6/085 318/400.29 |
| 2016/0302278 A1* | 10/2016 | Zhang .................... H05B 45/10 |

FOREIGN PATENT DOCUMENTS

| | | |
|---|---|---|
| CN | 103036494 A | 4/2013 |
| DE | 10 2006 030 594 A1 | 1/2008 |
| DE | 10 2007 050 298 A1 | 4/2009 |
| FR | 3 013 919 A1 | 5/2015 |
| JP | 2001-102233 A | 4/2001 |

\* cited by examiner

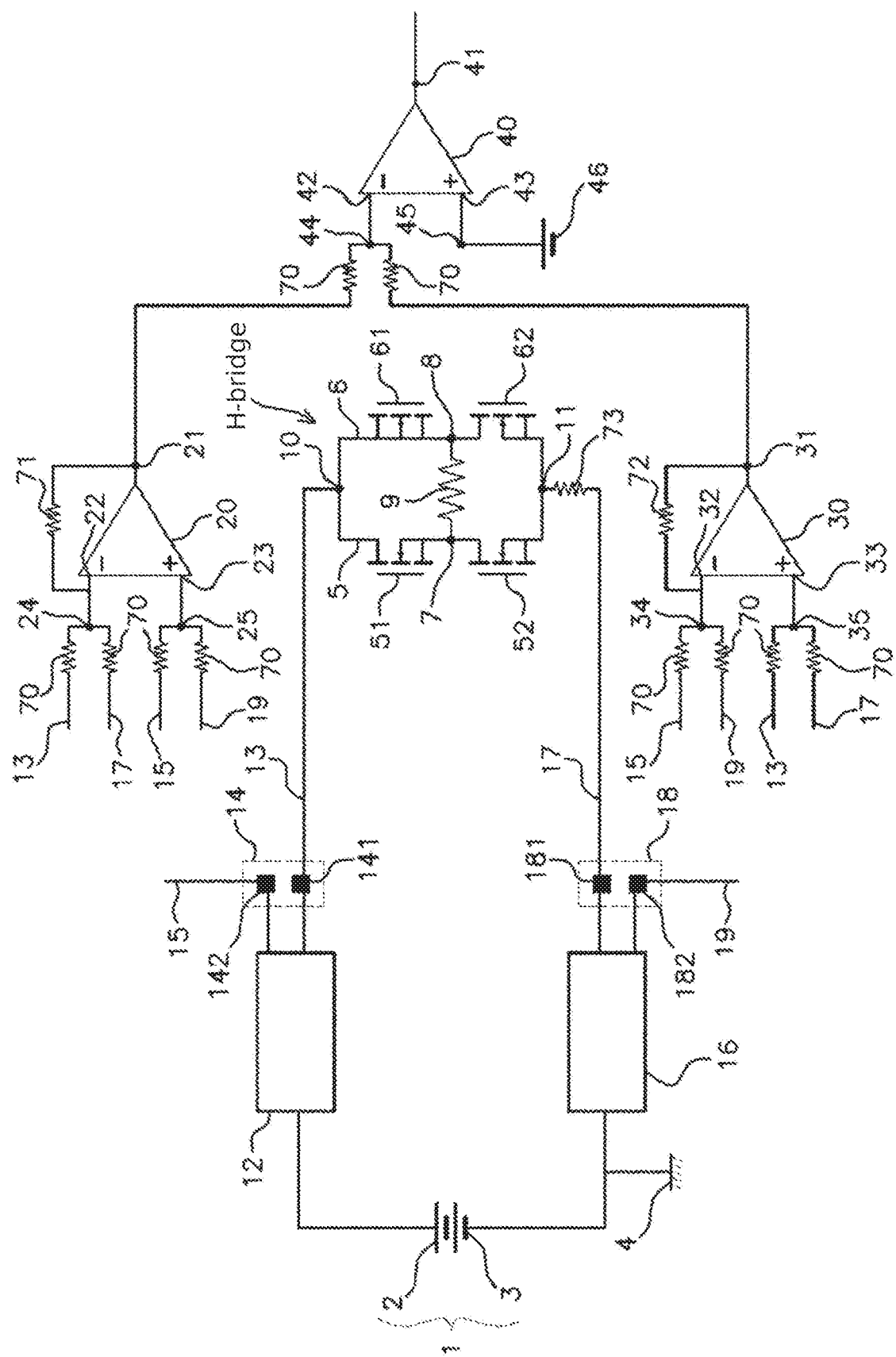

DEVICE FOR DETECTING A SHORT CIRCUIT OF AN H BRIDGE

The present invention relates to a device for detecting a short circuit in an H-bridge. A particularly advantageous, although in no way limiting, application of the present invention is in devices for detecting short circuits in H-bridges that are incorporated within automotive vehicles and that manage the supply of power to a load, such as an actuator.

BACKGROUND OF THE INVENTION

Currently, various devices exist for detecting a short circuit in an H-bridge, the latter being configured so that a determined current flows from one terminal to another of a load arranged at its center in order to bias said load. Specifically, it is important to be capable of detecting this type of fault in order to protect and to maintain the integrity of said load, but also of various electronic components that are linked to the H-bridge via conductive tracks, such as connectors or control modules.

This type of protection device is, for example, advantageously incorporated within automotive vehicles where H-bridges include loads such as injectors or even self-synchronous motors.

Conventionally, a device for detecting a short circuit in an H-bridge includes a printed circuit board (PCB) provided with conductive tracks. At least two of these tracks link the input and the output of the H-bridge to an electrical power supply and to an electrical ground, respectively.

One means for detecting a short circuit in an H-bridge typically consists in indirectly measuring currents flowing upstream and downstream of the input and of the output, respectively, of the H bridge. The term "indirect measurement" is understood here to mean one or more measurements of electrical potentials across the terminals of elements exhibiting resistance to the flow of the current passing therethrough. To this end, said device generally includes resistive elements, such as, for example, measurement shunts, that are arranged at the input and output of the H-bridge and through which the current delivered by the power supply flows, and that are linked to means for measuring the electrical potentials across the terminals of said resistive elements.

These measurement means are configured to detect a (power supply or ground) short circuit in the H-bridge by comparing said electrical potentials. These means are conventionally operational amplifiers. Thus, a device for detecting a short circuit in an H-bridge generally includes at least two amplifiers that are capable of comparing the respective electrical potentials across the terminals of said resistive elements. Consequently, the greater the number of H-bridges to be controlled in a printed circuit board, the greater the number of resistive elements and measurement means.

Accordingly, such a detection device necessitates, in addition to a printed circuit board area that is non-negligible relative to the surroundings within which it is incorporated, a routing diagram that is complex due to the numerous electronic components and resistive elements that are required for its operation.

Furthermore, the use of resistive elements, such as measurement shunts, in series with the input and the output of the H-bridge leads to losses in efficiency with respect to the power that is actually delivered by the power supply and that is intended primarily for the operation of the load of the H-bridge. In addition to this, measuring electrical potentials across the terminals of measurement shunts is a non-trivial operation that requires a certain level of accuracy.

SUMMARY OF THE INVENTION

The objective of the present invention is to overcome all or some of the drawbacks of the prior art, in particular those presented above, by proposing a solution that makes it possible to have devices for detecting a short-circuit in a half H-bridge that have a simple routing diagram limiting the area of the printed circuit board that has to be used and suitable for use without measurement shunts in series with the input and the output of the H-bridge.

To this end, the invention relates to a device for detecting a short circuit in an H-bridge, said device including a printed circuit board provided with conductive tracks and including:
  a power supply track linking the H-bridge to a first connection zone that is intended to be connected to a first multipin connector that is linked to a power supply terminal of a power supply source;
  a ground track linking the H-bridge to a second connection zone that is intended to be connected to a second multipin connector that is linked to a reference terminal of the power supply source.

Additionally, said device comprises means for measuring two electrical potentials at two different points on said first multipin connector, as well as two electrical potentials at two different points on said second multipin connector, and processing means that are configured to detect a short circuit in the H-bridge by comparing the electrical potentials measured on the first multipin connector and on the second multipin connector, respectively.

In particular embodiments, the device for detecting a short circuit in an H-bridge may furthermore include one or more of the following features, taken alone or in any technically possible combination.

In one particular embodiment, the measurement means include, at the first connection zone, a first contact zone and a second contact zone that are electrically isolated from one another on the printed circuit board, said first contact zone and said second contact zone being linked to the power supply track and to a first measurement track, respectively, and being intended to be connected to different respective pin points on the first connector.

In one particular embodiment, the measurement means include, at the second connection zone, a first contact zone and a second contact zone that are electrically isolated from one another on the printed circuit board, said first contact zone and said second contact zone being linked to the ground track and to a second measurement track, respectively, and being intended to be connected to different pin points on the second connector, respectively.

In one particular embodiment, said processing means include a first, a second and a third voltage comparator, each voltage comparator including two input terminals and an output terminal, and being capable of transitioning from a high logic state to a low logic state, and vice versa, when the voltage, in terms of absolute value, between its two input terminals is higher than a predefined threshold value, said first and second voltage comparators being configured to be:
  either both in the same logic state when the difference in the voltages measured on the first connector and on the second connector, respectively, is lower than said threshold value;
  or in two separate logic states, and said third comparator being configured to be in the low logic state and in the high logic state when the first and second comparators are in two separate logic states and in the same logic state, respectively.

In one particular embodiment, said first, second and third voltage comparators are a first, a second and a third operational amplifier, respectively, each including an output terminal, an inverting input terminal and a non-inverting input terminal.

In one particular embodiment, two additional resistors are arranged between the output terminal and the inverting input of the first and second amplifiers, respectively.

In one particular embodiment, a return resistor is arranged between the H-bridge and the ground track.

BRIEF DESCRIPTION OF THE DRAWINGS

The invention will be better understood upon reading the following description provided by way of completely non-limiting example and with reference to FIG. 1, which shows:

FIG. 1: a schematic representation of an exemplary embodiment of a device for detecting a short circuit in an H-bridge.

DETAILED DESCRIPTION OF THE PREFERRED EMBODIMENTS

FIG. 1 schematically shows an exemplary embodiment of a device for detecting a short circuit in an H-bridge.

Said detection device includes a printed circuit board provided with conductive tracks. Said conductive tracks are separated by an insulating material. By way of completely non-limiting example, said conductive tracks are made of copper and are separated by an epoxide polymer.

Said printed circuit board includes a power supply track 13 linking the H-bridge to a first connection zone 14 that is intended to be connected to a first multipin connector 12 that is linked to a power supply terminal 2 of a power supply source 1. By way of completely non-limiting example, said first multipin connector 12 includes an input, in the form of a socket, that is linked to the power supply terminal 2 of the power supply source 1 by means of a power supply cable that is inserted into said input socket.

Said printed circuit board also includes a ground track 17 linking the H-bridge to a second connection zone 18 that is intended to be connected to a second multipin connector 16 that is linked to a reference terminal 3 of the power supply source 1. Said reference terminal is additionally linked to an electrical ground 4 corresponding to a reference electrical potential. By way of completely non-limiting example, said second multipin connector 16 includes an output, in the form of a socket, that is linked to the reference terminal 3 of the power supply source 1 by means of a ground cable that is inserted into said output socket.

In the present completely non-limiting exemplary embodiment, the printed circuit board is incorporated within an automotive vehicle (not shown). Said power supply source 1 is the battery of said automotive vehicle, said electrical ground 4 being, for example, the metal body of the automotive vehicle.

The H-bridge includes two power supply branches 5, 6 that are connected in parallel between the power supply source 1 and the electrical ground 4. Each power supply branch 5, 6 includes a center tap 7, 8 that is linked to a terminal of a load 9, said load 9 being intended to have the current delivered by the power supply source 1 flow therethrough. In the present exemplary embodiment, said load 9 is an injector actuator.

Said device is used to detect a short circuit in the H-bridge. The term "short-circuit in the H bridge" is understood here to mean that one of the center taps 7, 8 of the H-bridge is directly linked either to the power supply terminal 2 of the power supply source 1 in the case of a short circuit to the power supply or to the reference terminal 3 of the power supply source 1 in the case of a short circuit to ground.

Each power supply branch 5, 6 of the H-bridge includes two MOSFET (metal-oxide-semiconductor field-effect transistor) transistors 51, 52, 61, 62 that are arranged on either side of the center tap 7, 8 of said power supply branch 5, 6. Each MOSFET transistor of the H-bridge is intended to switch from an on state to an off state by means of a control module (not shown), such as, for example, a microcontroller.

In the non-limiting example illustrated by FIG. 1, the power supply branches 5, 6 of the H bridge are connected in parallel between an input point 10 and an output point 11. Each power supply branch 5, 6 includes an N-channel transistor 51, 61, the drain and the source of which are linked to said input point 10 of the H-bridge and to the center tap 7, 8 of said power supply branch 5, 6, respectively, and an N-channel MOSFET transistor 52, 62, the drain and the source of which are linked to the center tap 7, 8 of said power supply branch 5, 6 and to said output point 11 of the H-bridge, respectively. In addition, said power supply track 13 and said ground track 17 link said first multipin connector 12 to the input point 10 of the H-bridge and said second multipin connector 16 to the output point 11 of the H-bridge, respectively.

Furthermore, the detection device comprises means for measuring two electrical potentials at two different points on said first multipin connector 12, as well as two electrical potentials at two different points on said second multipin connector 16.

In one particular completely non-limiting embodiment, illustrated by FIG. 1, the measurement means include, at the first connection zone 14, a first contact zone 141 and a second contact zone 142 that are electrically isolated from one another on the printed circuit board, said first contact zone 141 and said second contact zone 142 being linked to the power supply track 13 and to a first measurement track 15, respectively, and being intended to be connected to different respective pin points on the first connector 12.

As illustrated by FIG. 1, the measurement means also include, at the second connection zone 18, a first contact zone 181 and a second contact zone 182 that are electrically isolated from one another on the printed circuit board, said first contact zone 181 and said second contact zone 182 being linked to the ground track 17 and to a second measurement track 19, respectively, and being intended to be connected to different pin points on the second connector 16, respectively.

It should be noted that the first 12 and second 16 multipin connectors exhibit a respective intrinsic resistance that is representative of their capacity to oppose the flow of the current from the power supply source 1, this being due to their constituent materials but also, for example, due to the manner in which their respective pins are connected to the tracks of the printed circuit board (by soldering, by clip-fastening, etc.). Consequently, as soon as the current flows between two different points on one of the multipin connectors, an electrical potential difference arises between these two points, said potential difference being dependent on the intrinsic resistance of said connector.

The detection device additionally includes processing means that are configured to detect a short circuit in the H-bridge by comparing the electrical potentials measured on the first multipin connector 12 and on the second multipin connector 16, respectively.

In one particular embodiment, said processing means include a first 20, a second 30 and a third 40 voltage comparator. Each voltage comparator 20, 30, 40 includes two input terminals and an output terminal, and is capable both of carrying out arithmetic operations between electrical signals routed to each of its two input terminals and of transitioning from a high logic state to a low logic state, and vice versa, when the voltage, in terms of absolute value, between its two input terminals is higher than a predefined threshold value. To this end, the output terminal of each voltage comparator is at a high or low electrical potential depending on whether said comparator is in the high logic state or in the low logic state, respectively, said high potential being higher than said low potential.

In addition, said first 20 and second 30 voltage comparators are configured to be:

either both in the same low logic state when the difference in the voltages between their respective input terminals is lower than said threshold value;

or in two separate logic states, and said third comparator 40 being configured to be in the low logic state and in the high logic state when the first 20 and second 30 comparators are in two separate logic states and in the same logic state, respectively.

As illustrated by FIG. 1 in a completely non-limiting manner, said voltage comparators include a first operational amplifier 20, a second operational amplifier 30 and a third operational amplifier 40, each including an output terminal 21, 31, 41, an inverting input terminal 22, 32, 42 and a non-inverting input terminal 23, 33, 43. The first 20 and second 30 operational amplifiers are supplied with power by supply voltages, which are equal to one another in terms of absolute value and also equal, in terms of absolute value, to said threshold value. The first 20 and second 30 operational amplifiers are configured so as to operate in linear mode (corresponding therefore to the low logic state in this example) when the H-bridge is not short-circuited. They also capable of operating in saturation mode (corresponding therefore to the high logic state in this example) when the H-bridge is short-circuited. As regards the third operational amplifier 40, it is configured so as to operate as a threshold comparator in saturation mode.

The inverting input terminal 22 of the first amplifier 20 is linked to a first node 24, said first node 24 being linked to the power supply track 13 as well as to the ground track 17 by means of two respective mutually electrically insulated tracks that each include a resistor 70 of the same value R. As regards the non-inverting input terminal 23 of the first amplifier 20, it is linked to a second node 25, said second node 25 being linked to the first 15 and second 19 measurement tracks by means of two mutually electrically insulated tracks that each include a resistor 70 of the same value R.

Furthermore, and as illustrated in FIG. 1, the inverting input terminal 32 of the second amplifier 30 is linked to a third node 34, said third node 34 being linked to the first 15 and second 19 measurement tracks by means of two mutually electrically insulated tracks that each include a resistor 70 of the same value R. As regards the non-inverting input terminal 33 of the second amplifier 30, it is linked to a fourth node 35, said fourth node 35 being linked to the power supply track 13 as well as to the ground track 17 by means of two respective mutually electrically insulated tracks that each include a resistor 70 of the same value R.

In the non-limiting example illustrated by FIG. 1, the inverting input terminal 42 of the third amplifier 40 is linked to a fifth node 44, said fifth node 44 being linked to the respective output terminals 21, 31 of the first 20 and second 30 operational amplifiers by means of two respective mutually electrically insulated tracks that each include a resistor 70 of the same value R. The non-inverting input terminal 43 of the third amplifier 40 is linked to a sixth node 45, said sixth node 45 being linked to an electrical source 46, the potential of which is chosen to be equal to half of said threshold value.

In addition, the output terminal 41 of the third amplifier 40 is intended to be linked to a processing module (not shown). Said processing module includes a set of means that are configured on the basis of software (specific computer program product) and/or hardware (FPGA, PLD, ASIC, etc.) both to measure the potential of said output terminal 41 and to drive the control module of each MOSFET transistor of the H-bridge.

In the present embodiment of the detection device and as illustrated by FIG. 1, two additional resistors 71, 72 are arranged between the output terminal 21, 31 and the inverting input 22, 32 of the first 20 and second 30 amplifiers, respectively. Such arrangements of resistors are known to those skilled in the art since they make it possible to modulate the voltages of the respective output terminals 21, 31 of said first 20 and second 30 amplifiers.

Furthermore, a resistor referred to as a "return" resistor 73 is arranged between the H-bridge and the ground track 17, said return resistor 73 being capable of limiting any electrical flow returning to the second connector 16, and hence to the electrical ground 4.

Such a configuration of the first 14 and second 18 connection zones, as well as of the measurement means, is advantageous since it allows the first 15 and second 19 measurement tracks to be at the same potential as the power supply terminal 2 of the power supply source 1 and the electrical ground 4, respectively.

Specifically, the current delivered by the power supply source 1 and routed to the respective inputs of the first connector 12 and of the second connector 16 does not flow from said inputs to the second contact zone 142 of the first connection zone 14 and the second contact zone 182 of the second connection zone 18, respectively. This is due to the fact that said second contact zone 142 of the first connection zone 14 (or the second contact zone 182 of the second connection zone 18) is linked, by means of the first measurement track 15 (or second measurement track 19), to the first 20 and second 30 amplifiers, the respective input resistances of which are infinite. Thus, the electrical potential of the pin of the first connector 12 that is connected to the second contact zone 142 of the first connection zone 14 (or the pin of the second connector 16 that is connected to the second contact zone 182 of the second connection zone 18) is identical to that of the power supply terminal 2 of the power supply source 1 (or of the electrical ground 4).

However, the current delivered by the power supply source 1 flows between the first connector 12 and the H-bridge (or the H-bridge and the second connector 16) by means of the power supply track 13 (or the ground track 17). This current flow is accompanied by a drop in potential between the input of the first connector 12 (or of the second connector 16) and the first contact zone 141 of the first connection zone 14 (or the first contact zone 181 of the second connection zone 18) due to the intrinsic resistance of said first connector 12 (or of said second connector 16). This results in the potential of the power supply track 13 (or of the ground track 17) being lower than the potential of the power supply terminal 2 (or higher than the potential of the electrical ground 4).

Thus, on the one hand, the potentials of the first node 24 and of the fourth node 35 are equal to half of the sum of the respective potentials of the power supply track 13 and of the ground track 17. On the other hand, the potentials of the second node 25 and of the third node 34 are equal to half of the sum of the respective potentials of the first measurement track 15 and of the second measurement track 19.

Throughout the rest of the description, it is assumed that the intrinsic resistances of the first 12 and second 16 connectors are substantially equal.

When the H-bridge is operating nominally, i.e. without a short circuit, the difference in potential between the power supply track 13 and the power supply terminal 2 of the power supply source 1 is substantially equal to the difference in potential between the ground track 17 and the reference terminal 3 of the power supply source 1. This is because the same current flows through the first 12 and second 16 connectors and their respective intrinsic resistances are substantially identical. The respective input terminals of the first 20 and second 30 amplifiers are consequently substantially all at the same potential, such that their respective output terminals 21, 31 have a potential that is substantially zero and that said first 20 and second 30 amplifiers are in the low logic state. Thus, the inverting input terminal 42 of the third amplifier 40 is at a low potential. Consequently, the output terminal 41 of said third amplifier 40 is at the high potential.

When the H-bridge is shorted to the electrical ground 4, no current flows through the ground track 17, and hence through the second connector 16. Consequently, the difference in potential between the input terminals of the first amplifier 20, as well as that between the input terminals of the second amplifier 30, grow linearly, according to an amplification coefficient that is specific to each of said amplifiers, until reaching, in terms of absolute value, the threshold value, which they are not able to exceed since they operate in saturation mode therebeyond. The output terminals 21, 31 of the first 20 and second 30 amplifiers are then at a low potential and at a high potential, respectively, such that the inverting input terminal 42 of the third amplifier 40 is at a high potential. The input terminals of the third amplifier 40 are therefore all at the same high potential, such that the output terminal 41 of said third amplifier 40 is at a low potential.

When the H-bridge is shorted to the power supply terminal 2 the power supply source 1, no current flows through the power supply track 13, and hence through the first connector 12. Consequently, and for reasons that are similar to those given above for the case of a short circuit to the electrical ground 4, the output terminal 41 of the third amplifier 40 is at a low potential.

In this way, it is understood that the configuration of the detection device is advantageous in as much as it makes it possible to detect a short circuit in the H-bridge by means of the measurement of a low potential at the output of the third amplifier 40. In addition, this detection of a short circuit is achieved in particular by virtue of the use and the configuration of the first 12 and second 16 connectors, which may furthermore be used to carry out functions other than those related to the detection of a short circuit. Thus, no additional component, such as measurement shunts, needs to be added by a person skilled in the art in series with the inputs and outputs of the H-bridge.

Furthermore, it should be noted that the device such as described in the present application of detecting short circuits in a plurality of H-bridges that are connected in parallel between the power supply track 13 and the ground track 17. Specifically, the function of the first 20, second 30 and third 40 voltage comparators is to monitor that the current flowing through the first connector 12 is equal to the current flowing through the second connector 16, and to do so independently of the manner in which said current is distributed throughout electronic components arranged between said power supply track 13 and said ground track 17. Such a configuration of the measurement means therefore advantageously makes it possible to simplify the routing of the printed circuit board and to minimize the area of the latter.

More generally, it should be noted that the embodiments considered above have been described by way of non-limiting examples, and that other variants are therefore conceivable.

In particular, the invention has been described by considering a first amplifier 20 (or second amplifier 30), the inverting input 22 (or 32) of which is linked to the power supply track 13 and the ground track 17 (or to the first 15 and second 19 measurement tracks), and the non-inverting input 23 (or 33) of which is linked to the first 15 and second 19 measurement tracks (or to the power supply track 13 and the ground track 17). According to other examples, there is nothing to rule out having first 20 and second 30 amplifiers, the respective input terminals of which are inverted with respect to their connections to the tracks of the printed circuit board.

The invention claimed is:

1. A device for detecting a short circuit in an H-bridge, comprising:
    a printed circuit board provided with
        a first connection zone (14) configured for connection to a first multipin connector connected to a power supply terminal (2) of a power supply source (1),
        a power supply track (13) that connects an input point (10) of the H-bridge to the first connection zone (14), for connection to the power supply terminal (2) of the power supply source (1),
        a second connection zone (18) configured for connection to a second multipin connector connected to a reference terminal (3) of the power supply source (1), and
        a ground track (17) that connects an output point (11) of the H-bridge to the second connection zone (18), for connection to the reference terminal (3) of the power supply source (1);
    measurement means, comprising
        first and second contact zones (141,142) of the first connection zone (14), said first and second contact zones (141,142) being electrically isolated from one another on the printed circuit board, said first contact zone (141) being connected to the power supply track (13) and said second contact zone (141) being connected to a first measurement track, and
        third and fourth contact zones (181,182) of the second connection zone (18), said third and fourth contact zones (181,182) being electrically isolated from one another on the printed circuit board, said third contact zone (181) being connected to the ground track (17) and the fourth contact zone (182) being connected to a second measurement track (19); and processing circuits configured to detect a short circuit in the H-bridge by comparing electrical potentials of the power supply track (13) and the first measurement track (15) on the first connection zone (14) and of the ground track (17) and the second measurement track (19) on the second connection zone (18), wherein the first measurement track is configured to have a same potential as at the power supply terminal (2) of the power supply source (1), and the second measurement track is configured to have a same potential as the reference terminal (3) of the power supply source (1).

2. The device as claimed in claim 1, wherein a return resistor (73) is arranged between the H-bridge and the ground track (17).

3. The device as claimed in claim 1, wherein said processing circuits include a first voltage comparator (20), a second voltage comparator (30), and a third voltage comparator (40), outputs (21, 31) of the first and second voltage comparators (20, 30) being in connection with a first input (42) of the third comparator (40), and a second input (43) of the third comparator connected to ground, said first (20) and second (30) voltage comparators being configured to be:

both in a same logic state, when a difference in potential between the power supply track (13) and the first measurement track (15) is substantially equal to a difference in potential between the ground track (17) and the second measurement track (19), or else in different logic states from each other, and said third comparator (40) being configured to be in a low logic state when the first (20) and second (30) comparators are in said different logic states, and in a high logic state when the first (20) and second (30) comparators are in said same logic state.

4. The device as claimed in claim 1, wherein the device is arranged such that:

when the H-bridge is shorted to the power supply terminal (2) of the power supply source (1), no current flows through the power supply track (13) and the first contact zone (141), so that an output of a voltage comparator (40) of the device is at a low potential;

when the H-bridge is shorted to ground, no current flows through the ground track (17) and the third contact zone (181), so that the output of the voltage comparator (40) is at the low potential; and when the H-bridge is not shorted to either of the power supply terminal (2) or the ground, the output of the voltage comparator (40) is at a high potential.

5. The device as claimed in claim 1, wherein the power supply track (13) and the first measurement track (15) are configured for connection to different respective pin points on the first connector (12).

6. The device as claimed in claim 5, wherein a return resistor (73) is arranged between the H-bridge and the ground track (17).

7. The device as claimed in claim 5, wherein the measurement circuits include, at the second connection zone (18), a first contact zone (181) and a second contact zone (182) that are electrically isolated from one another on the printed circuit board, said first contact zone (181) and said second contact zone (182) being linked to the ground track (17) and to a second measurement track (19), respectively, and configured for connection to different pin points on the second connector (16), respectively.

8. The device as claimed in claim 7, wherein a return resistor (73) is arranged between the H-bridge and the ground track (17).

9. The device as claimed in claim 7, wherein said processing circuits include a first voltage comparator (20), a second voltage comparator (30), and a third voltage comparator (40), each one of said first, second, and third voltage comparators (20, 30, 40) including two input terminals and an output terminal, and each one of said first, second, and third voltage comparators configured to reversibly transition from a first logic state to a second logic state when a voltage, in terms of absolute value, between the two input terminals is higher than a predefined threshold value, a first of the two input terminals of the first voltage comparator connected to the power supply track (13) and the ground track (17), and a second of the two input terminals of the first voltage comparator connected to the first measurement track (15) and the second measurement track (19), and a first of the two input terminals of the second voltage comparator connected to the first measurement track (15) and the second measurement track (19), and a second of the two input terminals of the second voltage comparator connected to the power supply track (13) and the ground track (17), said first (20) and second (30) voltage comparators being configured to be:

both in a same logic state, when a difference in potential between the power supply track (13) and the first measurement track (15) is substantially equal to a difference in potential between the ground track (17) and the second measurement track (19), or else in different logic states from each other, and said third comparator (40) being configured to be in a low logic state when the first (20) and second (30) comparators are in said different logic states, and in a high logic state when the first (20) and second (30) comparators are in said same logic state.

10. The device as claimed in claim 9, wherein a return resistor (73) is arranged between the H-bridge and the ground track (17).

11. The device as claimed in claim 1, wherein the ground track (17) and the second measurement track (19) are configured for connection to different respective pin points on the second connector (16).

12. The device as claimed in claim 11, wherein a return resistor (73) is arranged between the H-bridge and the ground track (17).

13. The device as claimed in claim 1, wherein said processing circuits include a first voltage comparator (20), a second voltage comparator (30), and a third voltage comparator (40), each one of said first, second, and third voltage comparators (20, 30, 40) including two input terminals and an output terminal, and each one of said first, second, and third voltage comparators configured to reversibly transition from a first logic state to a second logic state when a voltage, in terms of absolute value, between the two input terminals is higher than a predefined threshold value, a first of the two input terminals of the first voltage comparator connected to the power supply track (13) and the ground track (17), and a second of the two input terminals of the first voltage comparator connected to the first measurement track (15) and the second measurement track (19), and a first of the two input terminals of the second voltage comparator connected to the first measurement track (15) and the second measurement track (19), and a second of the two input terminals of the second voltage comparator connected to the power supply track (13) and the ground track (17), said first (20) and second (30) voltage comparators being configured to be:
   both in a same logic state, when a difference in potential between the power supply track (13) and the first measurement track (15) is substantially equal to a difference in potential between the ground track (17) and the second measurement track (19), or else
   in different logic states from each other, and said third comparator (40) being configured to be in a low logic state when the first (20) and second (30) comparators are in said different logic states, and in a high logic state when the first (20) and second (30) comparators are in said same logic state.

14. The device as claimed in claim 13, wherein a return resistor (73) is arranged between the H-bridge and the ground track (17).

15. The device as claimed in claim 13, wherein said first (20), second (30) and third (40) voltage comparators are a first, a second and a third operational amplifier, respectively, each including an output terminal (21, 31, 41), an inverting input terminal (22, 32, 42) and a non-inverting input terminal (23, 33, 43).

16. The device as claimed in claim 15, wherein a return resistor (73) is arranged between the H-bridge and the ground track (17).

17. The device as claimed in claim 15, wherein two resistors (71, 72) are arranged between the output terminal (21, 31) and the inverting input of the first (20) and second (30) amplifiers, respectively.

18. The device as claimed in claim 17, wherein a return resistor (73) is arranged between the H-bridge and the ground track (17).

* * * * *